United States Patent
Yang et al.

(10) Patent No.: US 12,241,575 B2
(45) Date of Patent: Mar. 4, 2025

(54) BLIND INSERT FLUID CONNECTION MODULE

(71) Applicant: DELTA ELECTRONICS, INC., Taoyuan (TW)

(72) Inventors: Ming-Tang Yang, Taoyuan (TW); Teng-Chiao Shen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 18/395,635

(22) Filed: Dec. 25, 2023

(65) Prior Publication Data

US 2024/0125417 A1   Apr. 18, 2024

Related U.S. Application Data

(62) Division of application No. 17/170,842, filed on Feb. 8, 2021, now Pat. No. 11,898,674.

(30) Foreign Application Priority Data

May 8, 2020 (CN) .......................... 202010382907.4

(51) Int. Cl.
*F16L 37/00* (2006.01)
*H05K 7/20* (2006.01)

(52) U.S. Cl.
CPC .......... *F16L 37/00* (2013.01); *H05K 7/20781* (2013.01)

(58) Field of Classification Search
CPC ... F16L 37/00; F16L 27/1021; H05K 7/20781
See application file for complete search history.

(56) References Cited

U.S. PATENT DOCUMENTS

| | | | |
|---|---|---|---|
| 2,841,419 A * | 7/1958 | Jay | F16L 27/1021 285/225 |
| 10,164,373 B1 | 12/2018 | Cheon et al. | |
| 10,701,838 B1 | 6/2020 | Conroy et al. | |
| 10,704,983 B1 | 7/2020 | Tian et al. | |
| 10,791,654 B2 | 9/2020 | McCordic et al. | |

(Continued)

FOREIGN PATENT DOCUMENTS

| | | | |
|---|---|---|---|
| AT | 324957 B | * | 9/1975 |
| CN | 101619790 A | | 1/2010 |

(Continued)

*Primary Examiner* — Zachary T Dragicevich
*Assistant Examiner* — James A Linford
(74) *Attorney, Agent, or Firm* — CKC & Partners Co., LLC

(57) ABSTRACT

A blind insert fluid connection module includes a first fluid connector located on a first assembly and a second fluid connector located on a second assembly. The second fluid connector is used to engage the first fluid connector in a first direction to form a fluid channel. The second assembly includes a main body, a guide structure, and a cushioning resilient member. The fastening member is located on the main body. The guide structure is located on the main body, and the second fluid connector is fixed on the guide structure. The cushioning resilient member is connected to the guide structure to provide a buffer displacement of the second fluid connector along the second direction when the first and second fluid connectors are joined, wherein an included angle is formed between the second direction and the first direction.

9 Claims, 7 Drawing Sheets

(56) References Cited

U.S. PATENT DOCUMENTS

| | | |
|---|---|---|
| 2004/0074541 A1 | 4/2004 | Sharpe |
| 2007/0274043 A1 | 11/2007 | Shabany |
| 2009/0322072 A1 | 12/2009 | Tiberghien et al. |
| 2016/0066480 A1 | 3/2016 | Eckberg et al. |
| 2017/0257980 A1 | 9/2017 | Fukunaga |
| 2018/0242478 A1 | 8/2018 | Cui et al. |
| 2018/0303007 A1 | 10/2018 | Gao et al. |
| 2019/0045652 A1 | 2/2019 | Hirano et al. |
| 2020/0260608 A1 | 8/2020 | Thibaut |
| 2021/0212232 A1* | 7/2021 | Li .................. H05K 7/1417 |

FOREIGN PATENT DOCUMENTS

| | | |
|---|---|---|
| CN | 103166051 A | 6/2013 |
| CN | 204088751 U | 1/2015 |
| CN | 104641161 A | 5/2015 |
| CN | 204424601 U | 6/2015 |
| CN | 107039845 A | 8/2017 |
| CN | 109058629 A | 12/2018 |
| CN | 109296861 A | 2/2019 |
| KR | 101969079 B1 | 8/2019 |

* cited by examiner

BLIND INSERT FLUID CONNECTION MODULE

CROSS-REFERENCE TO RELATED APPLICATION

This application is a Divisional Application of the U.S. application Ser. No. 17/170,842, filed Feb. 8, 2021, claims priority to China Application Serial Number 202010382907.4, filed May 8, 2020 which are herein incorporated by reference in their entireties.

BACKGROUND

Field of Disclosure

The present disclosure relates to a fluid connection module, and more particularly to a blind insert fluid connection module.

Description of Related Art

Computer servers provide their powerful computing power through the network, so that they can complete a large amount of work in a short time and provide services for a large number of users. Conventional servers are usually densely installed on racks, which are convenient for centralized installation in air-conditioned machine rooms.

Due to the continuous improvement of the computing power of the server, only the air-conditioned rooms are unable to meet the heat dissipation requirements of the servers. Therefore, water cooling systems are introduced into the servers. In order to meet the needs of server modularization and quick disassembly, the fluid channel connection of the water cooling system needs to be improved.

SUMMARY

The present disclosure provides a blind insert fluid connection module to deal with the needs of the prior art problems.

In one or more embodiments, a blind insert fluid connection module includes a first fluid connector on a first assembly and a second fluid connector on a second assembly. The second fluid connector is configured to engage the first fluid connector to form a fluid channel in a first direction. The second fluid connector includes a main body, a fastening member and a guide structure on the main body, and a cushioning resilient member. The second fluid connector is fixed to the guide structure. The cushioning resilient member is connected to the guide structure and configured to provide a buffer displacement of the second fluid connector in a second direction when the first and second fluid connectors are joined, wherein an included angle is formed between the second direction and the first direction.

In one or more embodiments, a blind insert fluid connection module includes a first fluid connector on a first assembly and a second fluid connector on a second assembly. The second fluid connector is configured to engage the first fluid connector to form a fluid channel in a first direction. The second fluid connector includes a main body, a fastening member and a guide structure on the main body, and a cushioning resilient member. The second fluid connector is movably connected with the guide structure. The cushioning resilient member is connected to the guide structure and configured to provide a buffer displacement of the second fluid connector in a second direction when the first and second fluid connectors are joined, wherein an included angle is formed between the second direction and the first direction.

In one or more embodiments, a blind insert fluid connection module includes a first fluid connector on a first assembly and a second fluid connector on a second assembly. The second fluid connector is configured to engage the first fluid connector to form a fluid channel in a first direction. The second fluid connector includes a main body and a fastening member and a guide structure on the main body. The guide structure includes an outer bracket fixed to the fastening member, an inner ring configured to secure the second fluid connector and a plurality of cushioning resilient pieces. The cushioning resilient pieces are interconnected between the inner ring and the outer bracket and configured to provide a buffer displacement of the second fluid connector in a second direction when the first and second fluid connectors are joined, wherein an included angle is formed between the second direction and the first direction.

In one or more embodiments, the first assembly has a positioning column of a polygonal cross section, the guide structure has a positioning hole of the polygonal cross section configured to be inserted by the positioning column such that the first and second fluid connectors are guided to be joined.

In one or more embodiments, the first assembly has a positioning plate of an arc-line section, a curved-line section, a straight-line section or a bent-line section, the guide structure has a positioning slot of the arc-line section, the curved-line section, the straight-line section or the bent-line section, configured to be inserted by the positioning plate such that the first and second fluid connectors are guided to be joined.

In one or more embodiments, the first assembly has at least two positioning pins, the guide structure has at least two positioning holes configured to be inserted by the at least two positioning pins such that the first and second fluid connectors are guided to be joined.

In one or more embodiments, the first assembly is a server rack, the second assembly is a server computing unit.

In one or more embodiments, the cushioning resilient member has a spiral spring surrounding the second fluid connector and in contact with the fastening member.

In one or more embodiments, the blind insert fluid connection module further includes a fluid tube coupled to the second fluid connector.

In one or more embodiments, the guide structure includes arc-shaped buffer pieces for positioning the second fluid connector.

In one or more embodiments, the cushioning resilient pieces are wave-shaped elastic sheets extending radially from the inner ring to the outer bracket.

In sum, the blind insert fluid connection module disclosed herein utilizes a positioning column, positioning plates, or positioning holes or slots to guide the first and second fluid connectors to a predetermined position, and utilizes a cushioning resilient member, arc-shaped buffer pieces, or cushioning resilient pieces to provide a buffer displacement when the first and second fluid connectors are engaged, so as to increase the margin of error during blind insertion.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
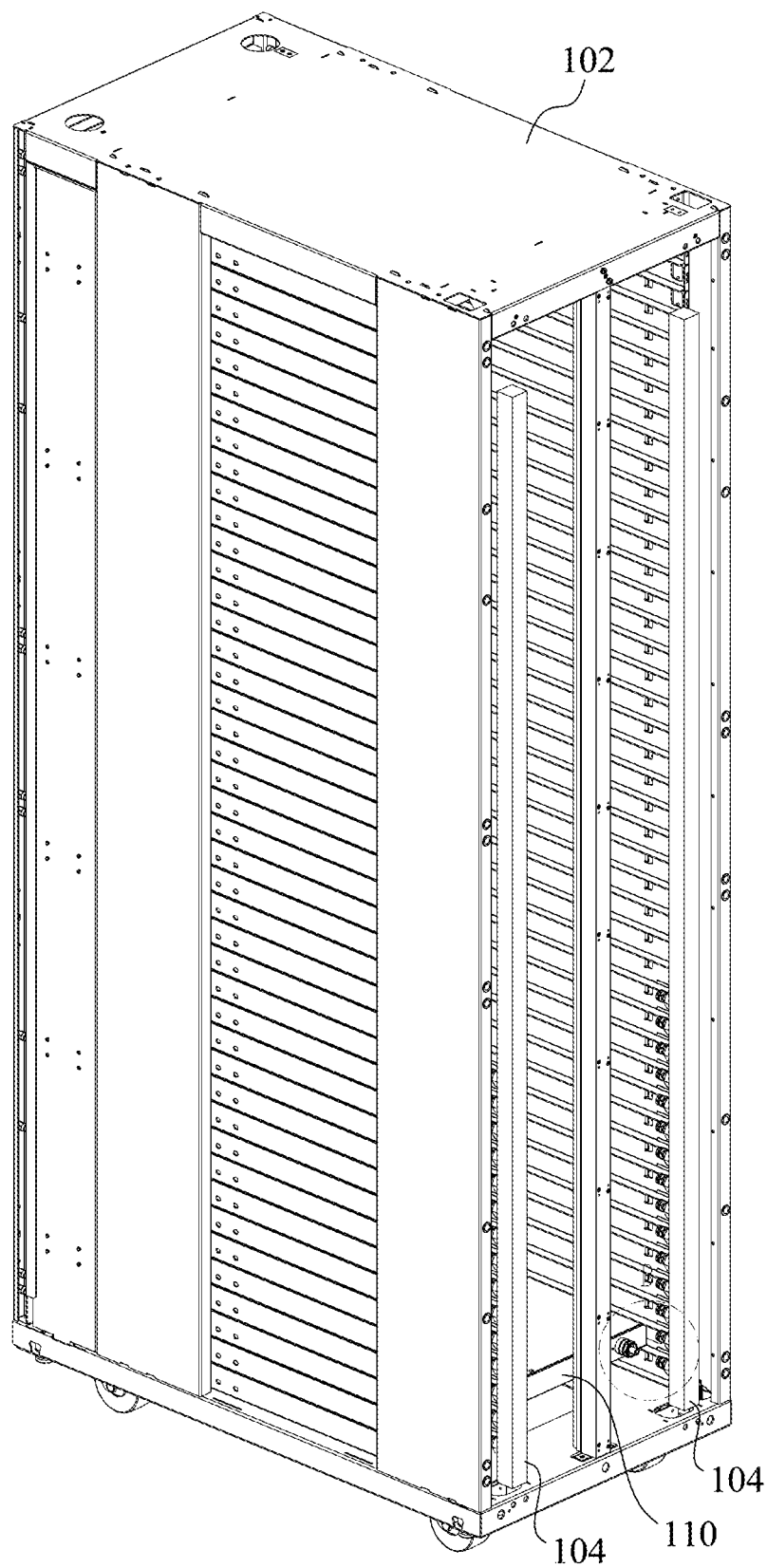
FIG. 1 illustrates a perspective view of a computer server assembly according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
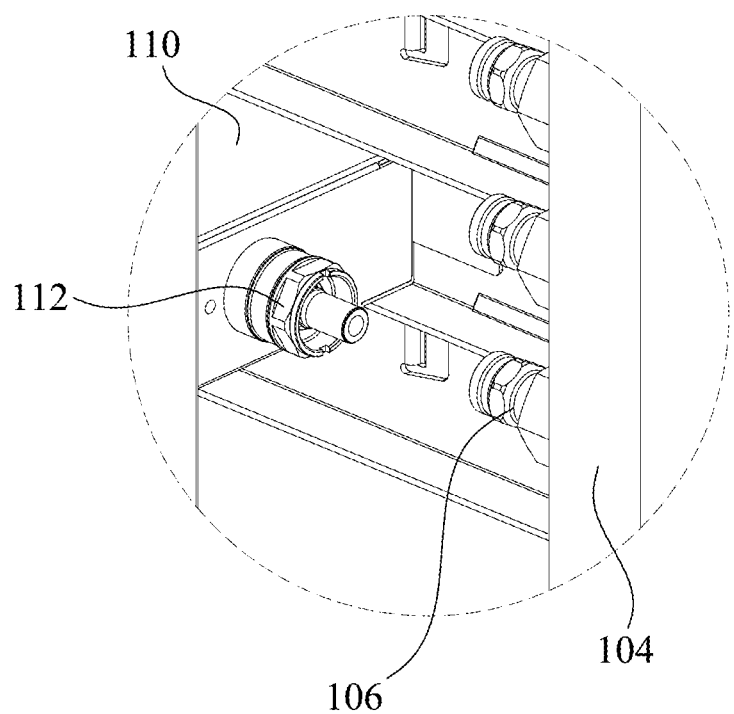
FIG. 2 illustrates an enlarged view of a portion of the computer server assembly in FIG. 1.

Reference is made to FIGS. 1 and 2. FIG. 1 illustrates a perspective view of a computer server 100 assembly according to one embodiment of the present disclosure, and FIG. 2 illustrates an enlarged view of a portion of the computer server assembly in FIG. 1. The computer server assembly 100 includes a server rack 102 and a plurality of server computing units 110 that are inserted within rails of the server rack 102 such that several computer server assemblies 100 can be densely installed in air-conditioned machine rooms. The server rack 102 may be equipped with at least two fluid channel posts 104 on which first fluid connectors 106 are installed. Each server computing unit 110 may be equipped with two second fluid connectors 112 configured to engage the first fluid connector 106 to form fluid channels such that cooling fluids can be circulated in the server computing unit 110 in operation to achieve the purpose of cooling and heat dissipation.

Figure 3:
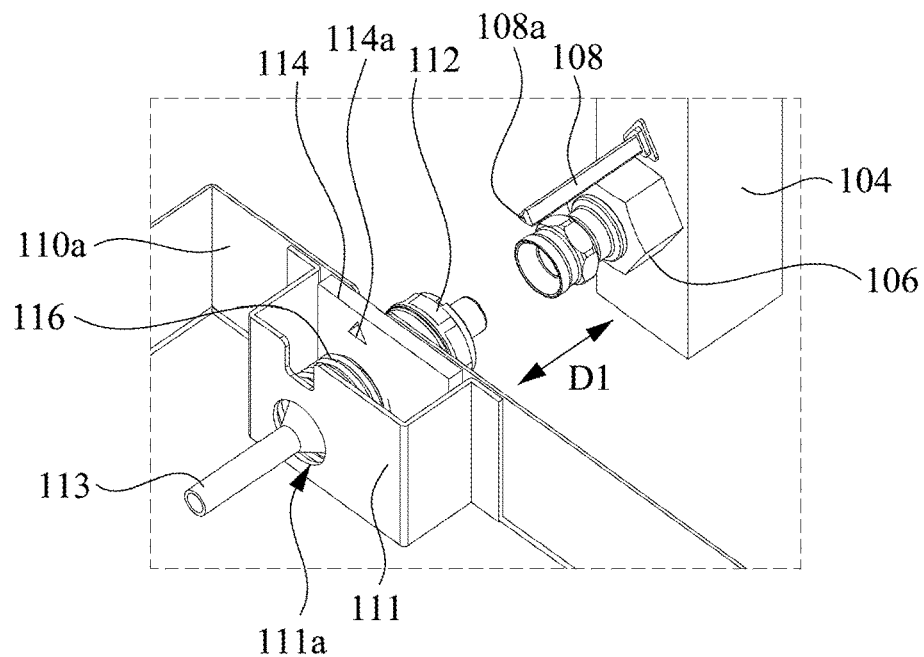
FIGS. 3, 4 illustrate perspective views of a blind insert fluid connection module according to a first embodiment of the present disclosure.
Figure 4:
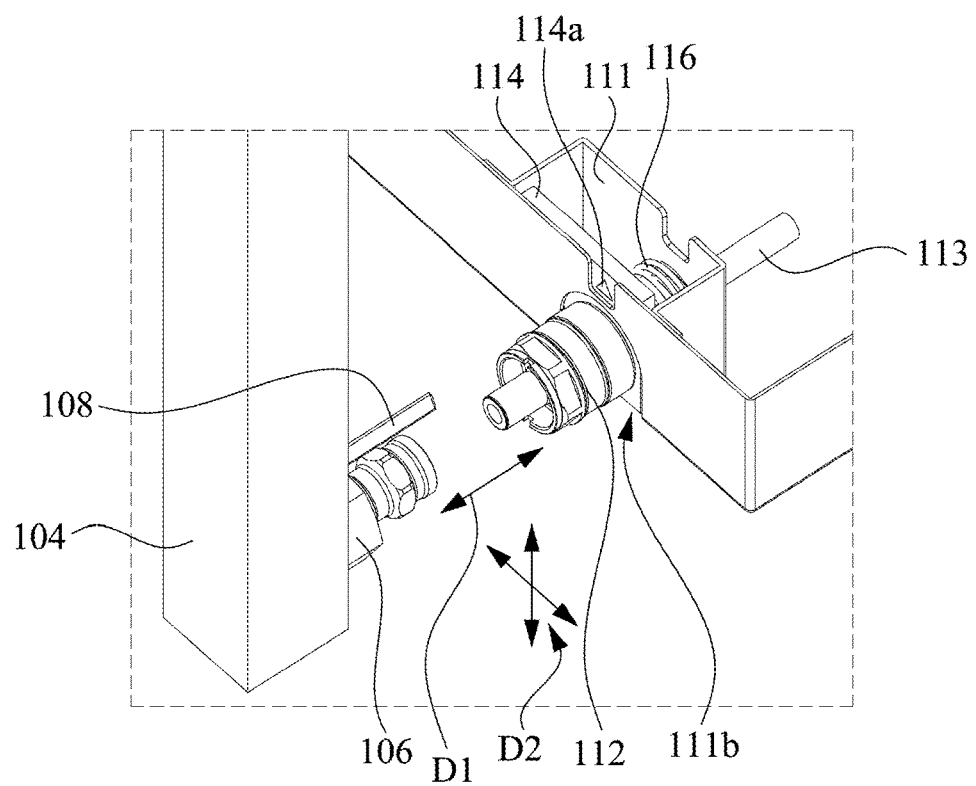

Reference is made to FIGS. 3, 4, which illustrate perspective views of a blind insert fluid connection module according to a first embodiment of the present disclosure. The blind insert fluid connection module may include the first fluid connectors 106 in a first assembly and the second fluid connector 112 in a second assembly. The first assembly may be the fluid channel post 104 of the server rack 102 (referring to FIG. 1) while the second assembly may be the server computing unit 110 (referring to FIG. 1). The second fluid connector 112 is configured to engage the first fluid connector 106 to form a fluid channel in a first direction.

In this embodiment, a fastening member 111 is located on a main body 110a of the server computing unit 110 (referring to FIG. 1) such that the second fluid connector 112 can be installed on the fastening member 111. A guide structure 114 is installed on the main body 110a and movable within the fastening member 111, and the second fluid connector 112 is fixed to the guide structure 114 such that these two members can be movable together and simultaneously. A spiral spring 116 surrounding the second fluid connector 112 as a cushioning resilient member, which is connected to the guide structure 114 and in contact with an inner wall of the fastening member 111. Therefore, the spiral spring 116 is configured to provide a buffer displacement (e.g., to meet an error margin during blind insertion) of the second fluid connector 112 along a second direction D2 when the first and second fluid connectors are joined. An included angle is formed between the second direction D2 and the first direction D1, or the second direction D2 is nonparallel to the first direction D1. FIG. 4 merely illustrates examples of the second directions D2, but not being limited thereto.

In this embodiment, the fluid channel post 104 has a positioning column 108 of a triangular cross section while the guide structure 114 has a positioning hole 114a of the same triangular cross section configured to be inserted by the positioning column 108 such that the first and second fluid connectors are guided to be joined, but not being limited thereto. For example, the fluid channel post 104 may also have a positioning column with a quadrangular, pentagonal, or other polygonal cross section, and the guide structure 114 may also have a positioning hole with the same quadrangular, pentagonal, or other polygonal cross section for the positioning column to insert. In addition, a leading end of the positioning column 108 may also have a taper end 108a, so as to increase the margin of error during blind insertion.

The main body 110a may have an opening 111b to expose the second fluid connector 112 and the positioning hole 114a, and an inner diameter of the opening 111b is slight greater than an outer diameter of the second fluid connector 112 such that the second fluid connector 112 may have a buffer displacement in the second direction D2. The second fluid connector 112 is connected to a fluid tube 113 through an opening 111a of the fastening member 111, thereby being connected to an external water-cooled heat dissipation system. An inner diameter of the opening 111a is slightly larger than an outer diameter of the fluid tube 113, so that the fluid tube 113 can have a space for buffering displacement.

Figure 5:
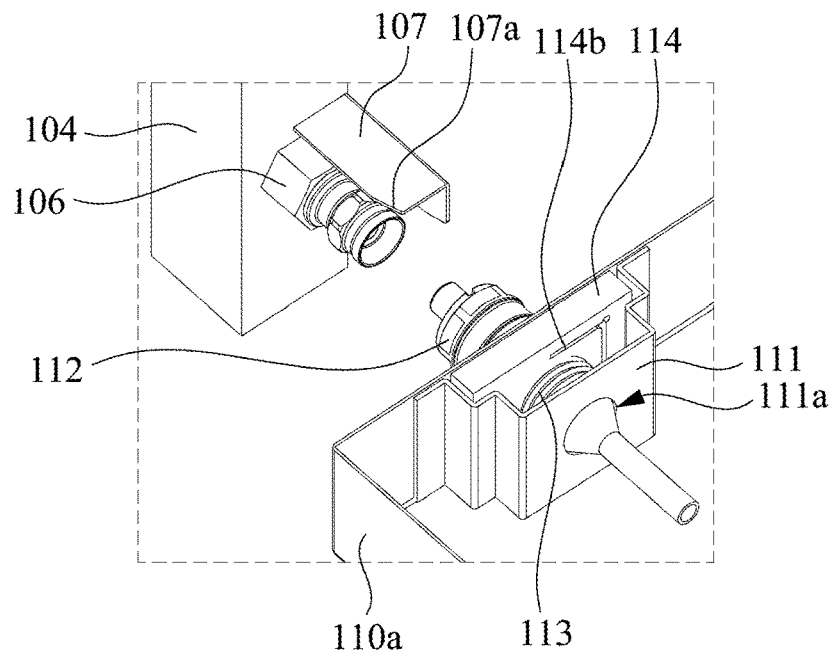
FIGS. 5, 6 illustrate perspective views of a blind insert fluid connection module according to a second embodiment of the present disclosure.
Figure 6:
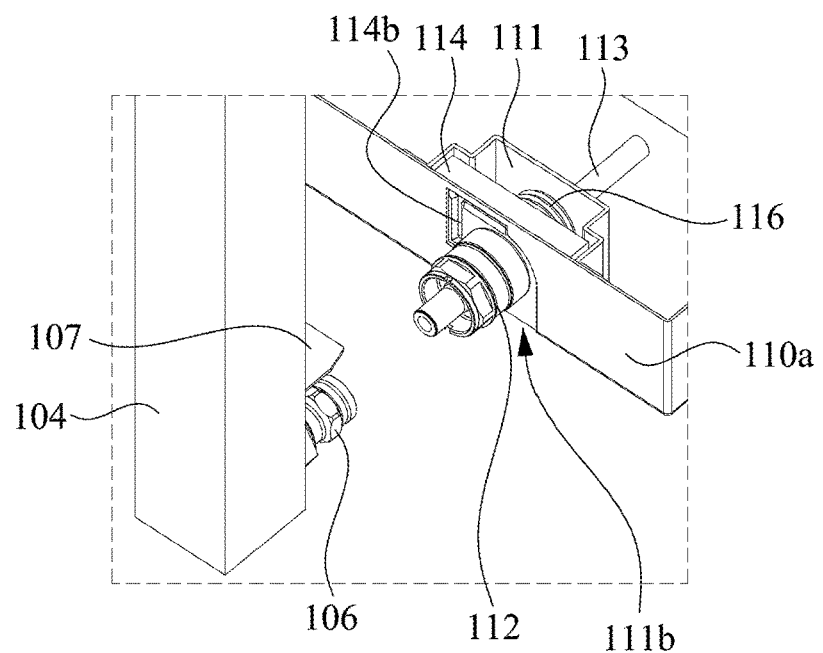

Reference is made to FIGS. 5, 6, which illustrate perspective views of a blind insert fluid connection module according to a second embodiment of the present disclosure. The second embodiment differs from the first embodiment mainly in the guide positioning mechanism. In particular, the fluid channel post 104 may have a positioning plate 107 of a bent-line cross section (e.g., a L-shaped cross section in the drawings) while the guide structure 114 may have a positioning slot 114b of the same bent-line cross section configured to be inserted by the positioning plate 107 such that the first and second fluid connectors are guided to be joined, but not being limited thereto. For example, the fluid channel post 104 may also have a positioning plate of an arc-line cross section, a curved-line cross section or a straight-line cross section while the guide structure 114 may have a positioning slot of the same arc-line cross section, curved-line cross section or straight-line cross section configured to be inserted by the positioning plate 107. In addition, a leading edge of the positioning plate 107 may also have a taper edge 107a so as to increase the margin of error during blind insertion.

Figure 7:
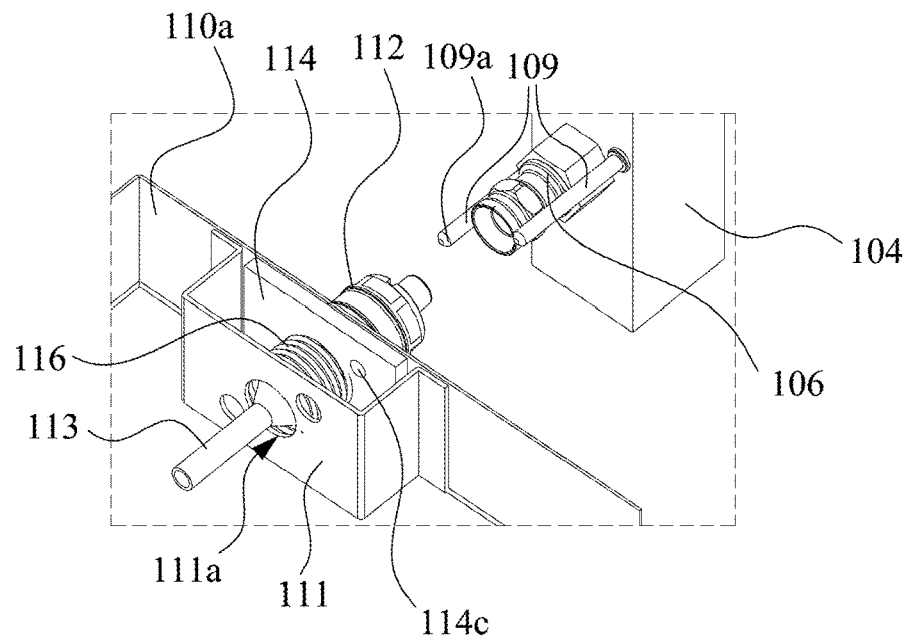
FIGS. 7, 8 illustrate perspective views of a blind insert fluid connection module according to a third embodiment of the present disclosure.
Figure 8:
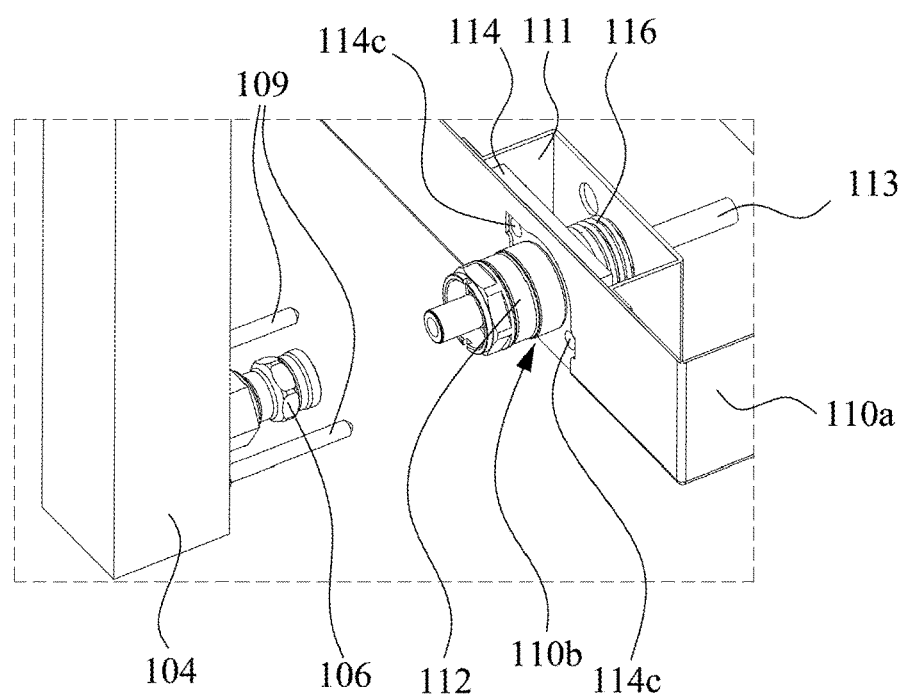

Reference is made to FIGS. 7, 8, which illustrate perspective views of a blind insert fluid connection module according to a third embodiment of the present disclosure. The third embodiment differs from the first embodiment mainly in the guide positioning mechanism. In particular, the fluid channel post 104 may have at least two positioning columns 109 while the guide structure 114 may have at least two positioning holes 114c configured to be inserted by the at least two positioning columns 109 such that the first and second fluid connectors are guided to be joined. In addition, a leading end of each positioning column 109 may also have a taper end 109a so as to increase the margin of error during blind insertion.

In this embodiment, the first fluid connector 106 is positioned between the two positioning columns 109 while the second fluid connectors 112 is positioned between two positioning holes 114c, but not being limited thereto.

Figure 9:
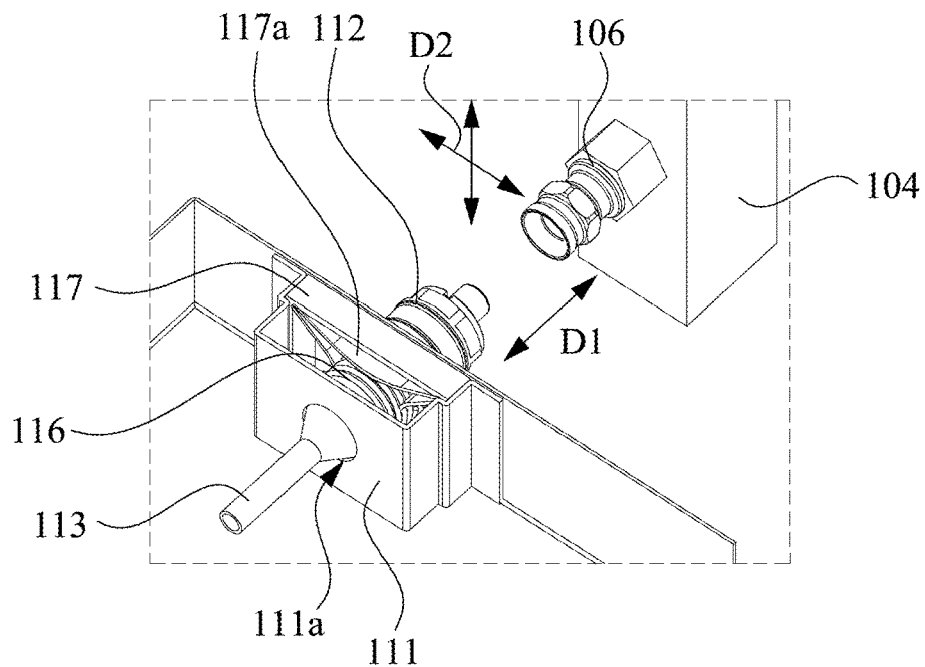
FIGS. 9, 10 illustrate perspective views of a blind insert fluid connection module according to a fourth embodiment of the present disclosure.
Figure 10:
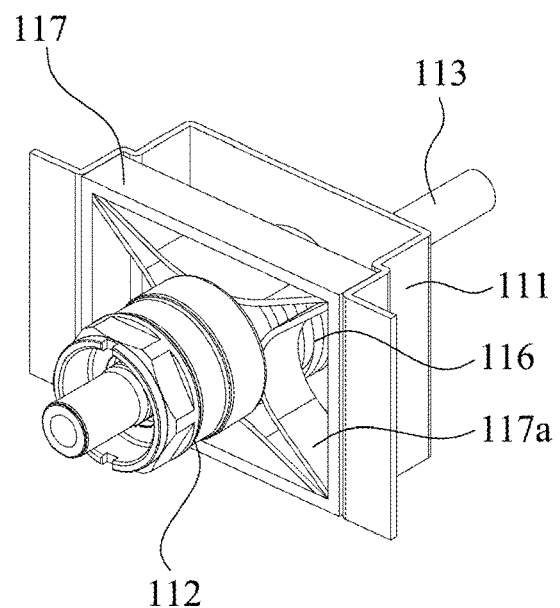

Reference is made to FIGS. 9, 10, which illustrate two perspective views of a blind insert fluid connection module according to a fourth embodiment of the present disclosure, wherein FIG. 10 illustrates the blind insert fluid connection module with the main body 110a removed. The fourth embodiment differs from the previous embodiments mainly in the guide positioning mechanism. In particular, the guide structure 117 is installed on the main body 110a and fixed within the fastening member 111 such that the guide structure 117 is unmovable relative to the fastening member 111. The guide structure 117 includes arc-shaped buffer pieces 117a (e.g., 4 pieces) for positioning the second fluid connector 112 therebetween such that the second fluid connector 112 is movably connected within the guide structure 117. Each arc-shaped buffer piece 117a has two opposite ends connected to two immediately-adjacent corners of the rectangular guide structure 117. This embodiment also utilizes the spiral spring 116 surrounding the second fluid connector 112 as a cushioning resilient member. Both the arc-shaped buffer pieces 117a and the spiral spring 116 are configured to provide a buffer displacement (e.g., to meet an error margin during blind insertion) of the second fluid connector 112 along a second direction D2 when the first and second fluid connectors are joined. An included angle is formed between the second direction D2 and the first direction D1, or the second direction D2 is nonparallel to the first direction D1. FIG. 9 merely illustrates examples of the second directions D2, but not being limited thereto.

Figure 11:
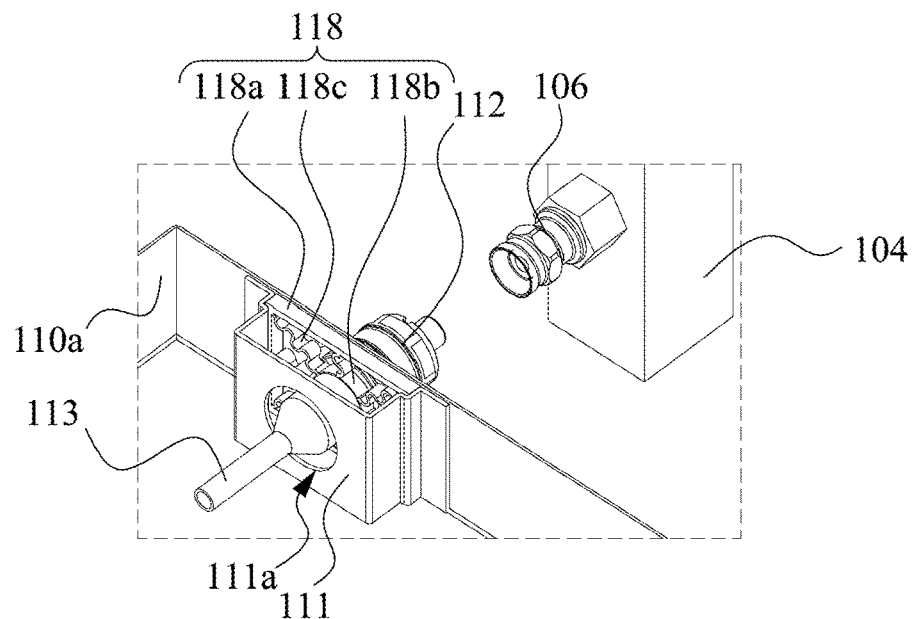
FIGS. 11, 12 illustrate perspective views of a blind insert fluid connection module according to a fifth embodiment of the present disclosure.
Figure 12:
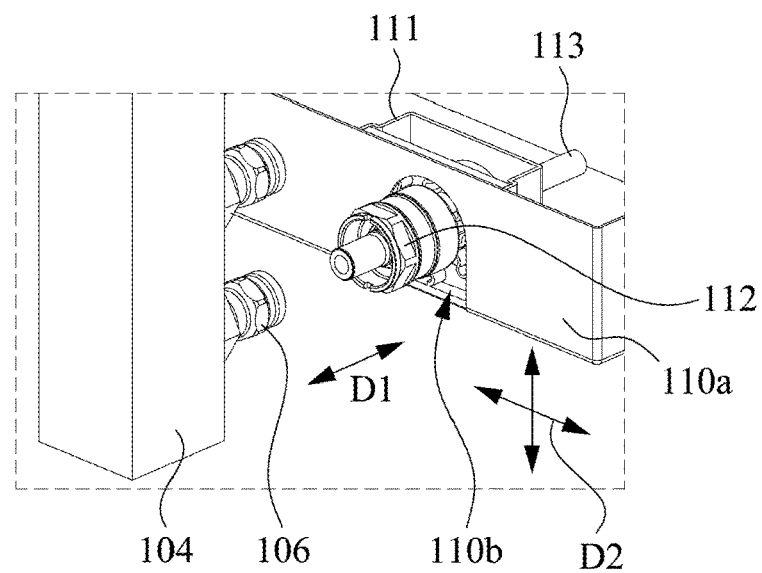

Reference is made to FIGS. 11, 12, which illustrate perspective views of a blind insert fluid connection module according to a fifth embodiment of the present disclosure. The fifth embodiment differs from the fourth embodiment mainly in the guide positioning mechanism. In particular, the guide structure 118 is installed on the main body 110a and positioned within the fastening member 111. The guide structure 118 includes an outer bracket 118a which is fixed within the fastening member 111 such that the outer bracket 118a is unmovable relative to the fastening member 111. The guide structure 118 further includes an inner ring 118b configured to secure the second fluid connector 112 within. Several cushioning resilient pieces 118c are interconnected between the outer bracket 118a and the inner ring 118b and configured to provide a buffer displacement (e.g., to meet an error margin during blind insertion) of the second fluid connector 112 in the second direction D2 when the first and second fluid connectors are joined. An included angle is formed between the second direction D2 and the first direction D1, or the second direction D2 is nonparallel to the first direction D1. FIG. 12 merely illustrates examples of the second directions D2, but not being limited thereto.

In this embodiment, these cushioning resilient pieces 118c are wave-shaped elastic sheets extending radially from the inner ring 118b to the outer bracket 118a, but not being limited thereto.

In previous embodiments, a single positioning plate 107 mates with a single positioning slot 114b as a guide mechanism, or a single positioning column 108 of a polygonal cross section mates with a single positioning hole 114a as a guide mechanism, which can achieve a rotational positioning of two planes and a smooth engagement for the first and second fluid connectors.

In sum, the blind insert fluid connection module disclosed herein utilizes a positioning column, positioning plates, or positioning holes or slots to guide the first and second fluid connectors to a predetermined position, and utilizes a cushioning resilient member, arc-shaped buffer pieces, or cushioning resilient pieces to provide a buffer displacement when the first and second fluid connectors are engaged, so as to increase the margin of error during blind insertion.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A blind insert fluid connection module comprising:
a first fluid connector disposed on a first assembly; and
a second fluid connector disposed on a second assembly, the second fluid connector configured to engage the first fluid connector to form a fluid channel in a first direction, the second assembly comprising:
a main body;
a fastening member disposed on the main body;
a guide structure disposed on the main body and the guide structure comprises:
an outer bracket fixed to the fastening member;
an inner ring configured to secure the second fluid connector; and
a plurality of cushioning resilient pieces interconnected between the inner ring and the outer bracket and configured to provide a buffer displacement of the second fluid connector in a second direction when the first and second fluid connectors are joined, wherein an included angle is formed between the second direction and the first direction, wherein the cushioning resilient pieces are wave-shaped elastic sheets extending radially from the inner ring to the outer bracket.

2. The blind insert fluid connection module of claim 1, wherein the first assembly is a server rack, the second assembly is a server computing unit.

3. The blind insert fluid connection module of claim 1 further comprising a fluid tube coupled to the second fluid connector.

4. The blind insert fluid connection module of claim 3, wherein the fastening member has an opening, and the fluid tube is coupled to the second fluid connector through the opening.

5. The blind insert fluid connection module of claim 1, wherein the cushioning resilient pieces comprise relatively long wave-shaped elastic sheets and relatively short wave-shaped elastic sheets extending radially from the inner ring to the outer bracket.

6. The blind insert fluid connection module of claim 1, wherein the outer bracket has a rectangular profile.

7. The blind insert fluid connection module of claim 6, wherein the cushioning resilient pieces comprise relatively long wave-shaped elastic sheets and relatively short wave-shaped elastic sheets, wherein one of the relatively long wave-shaped elastic sheets extends from the inner ring to a corner of the rectangular profile of the outer bracket.

8. The blind insert fluid connection module of claim 6, wherein the cushioning resilient pieces comprise relatively long wave-shaped elastic sheets and relatively short wave-shaped elastic sheets, wherein one of the relatively short wave-shaped elastic sheets extends from the inner ring to a middle point between two immediately-adjacent corners of the rectangular profile of the outer bracket.

9. The blind insert fluid connection module of claim 1, wherein the cushioning resilient pieces comprise relatively long wave-shaped elastic sheets and relatively short wave-shaped elastic sheets, one of the relatively short wave-shaped elastic sheets has an S-shaped profile.

\* \* \* \* \*